United States Patent [19]
Guha et al.

[11] Patent Number: 5,346,853
[45] Date of Patent: Sep. 13, 1994

[54] MICROWAVE ENERGIZED DEPOSITION PROCESS WITH SUBSTRATE TEMPERATURE CONTROL FOR THE FABRICATION OF P-I-N PHOTOVOLTAIC DEVICES

[75] Inventors: Subhendu Guha; Chi C. Yang; XiXiang Xu, all of Troy, Mich.

[73] Assignee: United Solar Systems Corporation, Troy, Mich.

[21] Appl. No.: 185,309

[22] Filed: Jan. 21, 1994

Related U.S. Application Data

[63] Continuation of Ser. No. 907,750, Jun. 29, 1992, abandoned.

[51] Int. Cl.$^5$ .................. H01L 21/00; H01L 21/02; H01L 21/326
[52] U.S. Cl. .................. 437/113; 437/101; 136/258; 136/261
[58] Field of Search ............ 437/101, 113; 136/258, 136/261

[56] References Cited

U.S. PATENT DOCUMENTS

| | | | |
|---|---|---|---|
| 4,492,810 | 1/1985 | Ovshinsky et al. | 136/258 |
| 4,504,518 | 3/1985 | Ovshinsky et al. | 427/38 |
| 4,515,107 | 5/1985 | Fournier et al. | 118/718 |
| 4,517,223 | 5/1985 | Ovshinsky et al. | 427/39 |
| 4,701,343 | 10/1987 | Ovshinsky et al. | 427/39 |
| 4,713,309 | 12/1987 | Johncock et al. | 430/65 |
| 4,715,927 | 12/1987 | Johncock et al. | 156/606 |
| 4,729,341 | 3/1988 | Fournier et al. | 118/723 |
| 4,770,369 | 9/1988 | Flock et al. | 244/3.1 |
| 5,194,398 | 3/1993 | Miyachi et al. | 437/101 |
| 5,232,507 | 8/1993 | Ohtoshi et al. | 118/719 |
| 5,248,348 | 9/1993 | Miyachi et al. | 136/258 |

FOREIGN PATENT DOCUMENTS

0279304 12/1987 Japan.

Primary Examiner—R. Bruce Breneman
Assistant Examiner—B. Everhart
Attorney, Agent, or Firm—Howard & Howard

[57] ABSTRACT

Substrate temperatures are maintained above 400° C. During the microwave energized glow discharge deposition of Group IV semiconductor materials. The substrate temperature range provides for the preparation of materials having improved electrical properties. Cell efficiency of a photovoltaic device of the p-i-n type is significantly improved by depositing the intrinsic layer using a microwave generated plasma and a substrate temperature in excess of 400° C. Maximum cell efficiency occurs for depositions carried out in the range of 400°–500° C.

2 Claims, 2 Drawing Sheets

MICROWAVE ENERGIZED DEPOSITION PROCESS WITH SUBSTRATE TEMPERATURE CONTROL FOR THE FABRICATION OF P-I-N PHOTOVOLTAIC DEVICES

This is a continuation of copending application Ser. No. 07/907,750 filed on Jun. 29, 1992 now abandoned.

FIELD OF THE INVENTION

This invention relates generally to preparation of thin film semiconductor materials. Specifically the invention relates to the glow discharge deposition of Group IV semiconductor alloy materials; and more specifically, the invention relates to a microwave energized glow discharge deposition process in which Group IV semiconductor alloys are deposited on substrates maintained in a particular temperature regime.

BACKGROUND OF THE INVENTION

Glow discharge decomposition is employed for the preparation of thin films of a variety of materials such as semiconductor materials, insulating materials, optical coatings, polymers and the like. In a typical glow discharge deposition, a process gas which includes a precursor of the material being deposited, is introduced into a deposition chamber, typically at subatmospheric pressure. Electromagnetic energy, either AC or DC, is introduced into the chamber and energizes the process gas so as to create an excited plasma therefrom. The plasma decomposes the precursor material and deposits a coating on a substrate maintained proximate the plasma region. Frequently the substrate is heated to facilitate growth of the deposit thereupon. This technology is well known in the art. Early glow discharge depositions employed either direct current, low frequency alternating current or radio frequency alternating current to energize the plasma; radio frequency current is still very widely employed for this purpose.

One particular drawback to certain prior art glow discharge deposition processes was their relatively low speed, and in an attempt to increase deposition rates those of skill in the art turned to the use of microwave energized plasmas. It was found that microwave energized glow discharge processes provided very high deposition rates. Initially, process parameters derived from radio frequency energized depositions were applied to microwave depositions; however, it has been found that plasma conditions encountered in a microwave process differ from those in radio frequency energized processes and hence necessitate changes in the various process parameters.

One important class of semiconductor materials which are manufactured by plasma deposition processes are the Group IV semiconductor alloys. Most typically these materials comprise alloys of silicon and/or germanium together with alloying, modifying and dopant elements, the most typical of which are hydrogen, halogens and the Group III and Group V elements. It has been found that Group IV semiconductor alloys deposited in high rate microwave processes tend to incorporate more hydrogen than do comparable materials prepared under radio frequency plasma conditions. Hydrogen content is a particularly important parameter for these semiconductor alloys since hydrogen tends to increase the band gap of the materials thereby changing their optical and electrical properties. If these hydrogen rich materials are incorporated into photovoltaic devices it has been found that increased hydrogen content will decrease the short circuit current of the cell ($J_{sc}$) and will increase the open circuit voltage ($V_{oc}$) of the device. Generally, it has been found that photovoltaic devices which include group IV semiconductor layers prepared in accord with prior art microwave energized deposition processes have efficiencies which are lower than the efficiencies of similar devices which include radio frequency deposited group IV semiconductor alloys.

As noted above, the substrate in a glow discharge deposition process is typically heated to facilitate growth of the deposit and it has been found that substrate temperature is a parameter which has a direct influence upon quality of the deposited semiconductor material and hence the efficiency of photovoltaic devices manufactured therefrom. In radio frequency energized processes it has been found that substrate temperatures in the range of 200° to 350° C. and preferably 275° to 300° C. are preferred for the preparation of silicon and/or germanium thin film alloy materials.

When the art turned to the use of microwave energized depositions, process parameters, including substrate temperature, were adapted from radio frequency processes. For example, U.S. Pat. Nos. 4,504,518; 4,517,223 and 4,701,343 all describe microwave energized glow discharge deposition processes. These patents acknowledge that radio frequency processes typically employ substrate temperatures in the range of 227°-327° C. and broadly recite that the microwave processes taught therein can operate with substrate temperatures in the range of 20° C. to 400° C. and that a preferred substrate temperature range for the processes is 250°-325° C. It is specifically recited therein that the preferred temperature range for the deposition of intrinsic silicon and silicon-germanium alloys is 275° C. and the preferred temperature range for the deposition of doped silicon alloy layers is 250°-300° C.

U.S. Pat. No. 4,715,927 teaches that silicon alloy materials may be prepared by a microwave process employing substrate temperatures of about 300° C. and that silicon-germanium alloys are preferably prepared at substrate temperatures of 275° C.

U.S. Pat. No. 4,470,369 teaches that p-doped, microcrystalline silicon alloy materials are prepared by a microwave deposition process employing substrate temperatures ranging from ambient to 275° C. with the preferred range being 150°-225° C.

U.S. Pat. No. 4,729,341 teaches the microwave deposition of silicon alloy materials at a preferred substrate temperature of about 300° C.

U.S. Pat. No. 4,515,107 shows the preparation of silicon alloy materials by a microwave process employing substrate temperatures of 350° C.

U.S. Pat. No. 4,713,309 shows the manufacture of amorphous silicon xerographic drums in a microwave deposition process employing substrate temperatures which are preferably 225° C.

It will be seen that prior art microwave deposition processes tend to follow radio frequency substrate temperature parameters and as such operate in a substrate temperature range in the neighborhood of 300° C. and even in the broadest teachings never exceed 400° C. The present invention resides in, and recognizes, the fact that plasma conditions in a microwave deposition process are uniquely different from those encountered in a radio frequency energized process. Substrate temperature ranges as taught in the prior art are inappropriate for microwave energized deposition processes. Improved semiconductor materials are obtained in a microwave energized deposition when the substrate temperature range is increased over that of the prior art. These and other advantages of the present invention will be readily apparent from the drawings, discussion, description and examples which follow.

BRIEF DESCRIPTION OF THE INVENTION

Disclosed herein is a method for the microwave energized deposition of a body of a Group IV semiconductor alloy material. In accord with the method there is provided a deposition system having a plasma region defined therein. The system includes a conduit for introducing a preselected process gas and a source of a preselected frequency of microwave energy for activating the process gas in the plasma region so as to decompose the gas and form a plasma therefrom. A substrate is supported in the plasma region of the deposition system and the substrate is maintained at a temperature in excess of 400° C. A process gas having a Group IV semiconductor element therein is introduced into the system and maintained at a pressure less than atmospheric. Microwave energy of said preselected frequency is input into the system at a power level at least sufficient to sustain a plasma of the process gas at said processed pressure in the plasma region. The microwave energy creates a plasma from, and decomposes, the processed gas so as to deposit a layer of Group IV semiconductor alloy material on the substrate. In one embodiment, the substrate is maintained at a temperature of at least 450° C. and in another embodiment the substrate is maintained at a temperature greater than 400° C. but no more than 500° C.

In another embodiment, the process gas may include silicon, germanium or combinations thereof. In other embodiments, the process gas may also include hydrogen, halogens, Group III elements, Group V elements and combinations thereof.

In some embodiments, the present invention may be integrated with radio frequency energized deposition steps wherein particular semiconductor layers of a device are deposited by prior art radio frequency techniques and other layers of the device are deposited by the microwave technique of the present invention. The invention may be employed in any microwave energized deposition process including processes operated in a continuous mode as well as those operated in a batch mode.

DETAILED DESCRIPTION OF THE INVENTION

The present invention recognizes the fact that substrate temperatures for microwave energized depositions of Group IV semiconductor materials must be higher than substrate temperatures in comparable radio frequency energized depositions. In most glow discharge depositions of semiconductor materials, particularly Group IV semiconductor materials, hydrogen is present in the process gas, generally as a diluent as well as a component of a semiconductor element containing gas, as for example silane, germane or the like. The microwaves produce a very intense hydrogen plasma and semiconductor films produced thereby tend to incorporate large amounts of hydrogen, as a result of the presence of highly active hydrogen species as well as the high deposition rate which tends to trap hydrogen in the depositing layer. An increase in the hydrogen content of Group IV semiconductor alloy materials tends to increase the band gap of those materials. When alloys of this type are incorporated into photovoltaic devices, the increased hydrogen content and consequent increased band gap increases the open circuit voltage of the device and decreases the short circuit current.

It has been found that the temperature of the substrate upon which the semiconductor material is deposited will have an effect on the hydrogen content of the material. As the substrate temperature increases, the hydrogen content of the deposited semiconductor material tends to decrease. As a consequence it has been found that increased substrate temperatures produce a lowering of band gap and a corresponding increase in short circuit current an decrease in open circuit voltage of photovoltaic devices. The overall efficiency of a photovoltaic device in converting incident light to electricity will depend upon many factors including short circuit current and open circuit voltage of the device as well as to the overall quality of the semiconductor material. It has been found that in a microwave energized deposition process, all other things being equal, the efficiency of photovoltaic devices produced thereby correlates with substrate temperature in the deposition apparatus. A substrate temperature which is either too low or too high will adversely affect device efficiency.

As noted above, for radio frequency energized depositions, it has been found that substrate temperatures of approximately 250° to 350° C., and preferably 300° C. produce optimum device efficiency. As a consequence, conventional wisdom is also held that similar temperature ranges are appropriate for microwave energized depositions. The present invention recognizes the fact that microwave plasma conditions differ from those encountered in radio frequency depositions; and as a consequence, different substrate temperature ranges are required for microwave energized depositions.

Figure 1:
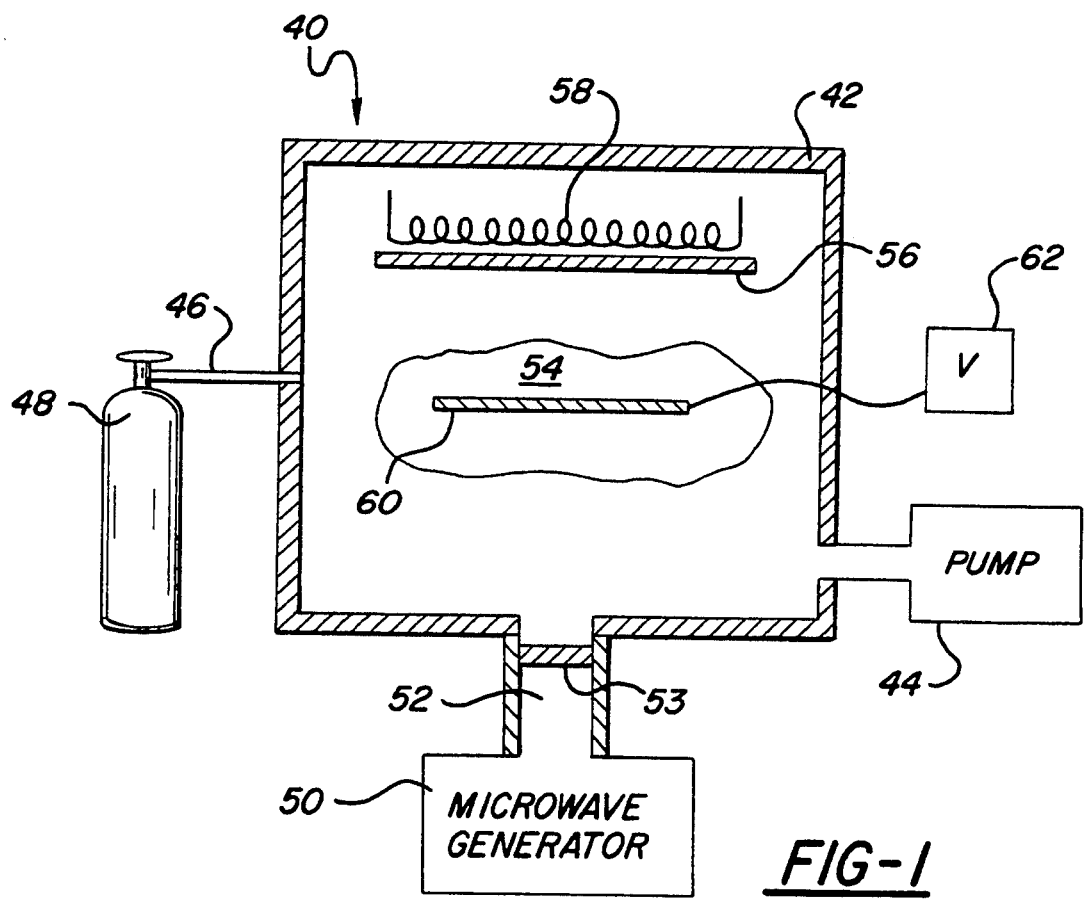
FIG. 1 is a schematic depiction of a microwave energized deposition system of the type which may be employed in the practice of the present invention.

Referring now to FIG. 1, there is shown a schematic depiction of a generalized microwave deposition system. The system 40 includes a chamber 42 which is sealable and capable of sustaining a subatmospheric pressure. In communication with the chamber 42 is a vacuum pump 44 and a conduit 46 for supplying a preselected gas mixture thereinto from the gas supply cylinder 48, it being understood that in most instances a mixture of gases from a manifolded supply system will generally be employed. By control of the pump 44 and the process gas conduit 46 an appropriate deposition atmosphere and pressure maybe maintained within the chamber 42. The apparatus 40 also includes a microwave generator 50 operably connected to the chamber 42 by a waveguide 52 having a microwave transmissive window 53 at one end thereof. The microwave generator 50 energizes the process gas in the chamber 42 so as to create a plasma therefrom in a plasma region 54. The apparatus of FIG. 1 also includes a deposition substrate 56 maintained proximate the plasma region 54 and includes a substrate heater 58. As depicted in this drawing, the heater 58 is a resistance heater although it is to be understood that radiant heaters and the like may be similarly employed. It should also be noted that the system includes a bias wire 60 disposed in the plasma region 54. The bias wire 60 is in electrical communication with a power supply 62 and it has been found that by imposition of an appropriate potential upon the bias wire 60, the bombardment of the substrate 56 by activated species in the plasma region 64 may be selectively controlled.

In a typical deposition process, an appropriate substrate is placed in the chamber 42, which is sealed and then pumped down by the vacuum pump 44 to a pressure substantially below atmospheric. In some instances, the chamber is purged with nitrogen, argon or some other such inert gas during the pump down to facilitate the removal of oxygen, water vapor or other potentially interfering species. The process gas is introduced into the chamber 42 from the conduit 46. The substrate heater 58 is energized so as to maintain the substrate 56 at a preferred deposition temperature in excess of 400° C. As will be appreciated by those of skill in the art, the substrate heater 58 may include a temperature sensor and associated control circuitry for purposes of maintaining a set temperature at the substrate 56. In the next stage of the process, the microwave generator 50 is energized and a plasma is generated from the process gas in the plasma region 54. The bias wire 60 is energized, typically with a positive voltage, and a film of semiconductor alloy material deposits onto the substrate 56. By control of the composition of the process gas, the composition of the resultant alloy layer may be controlled.

In many instances it has been found desirable to combine radio frequency and microwave energized deposition processes for the preparation of photovoltaic devices. Microwave energized processes provide for very high deposition rates and high gas utilization and consequently are important for the preparation of thick layers of semiconductor materials and/or when the cost of process gases mandate high rates of utilization. Radio frequency energized processes are employed when relatively thin layers of material, for example, doped layers are being deposited.

Figure 2:
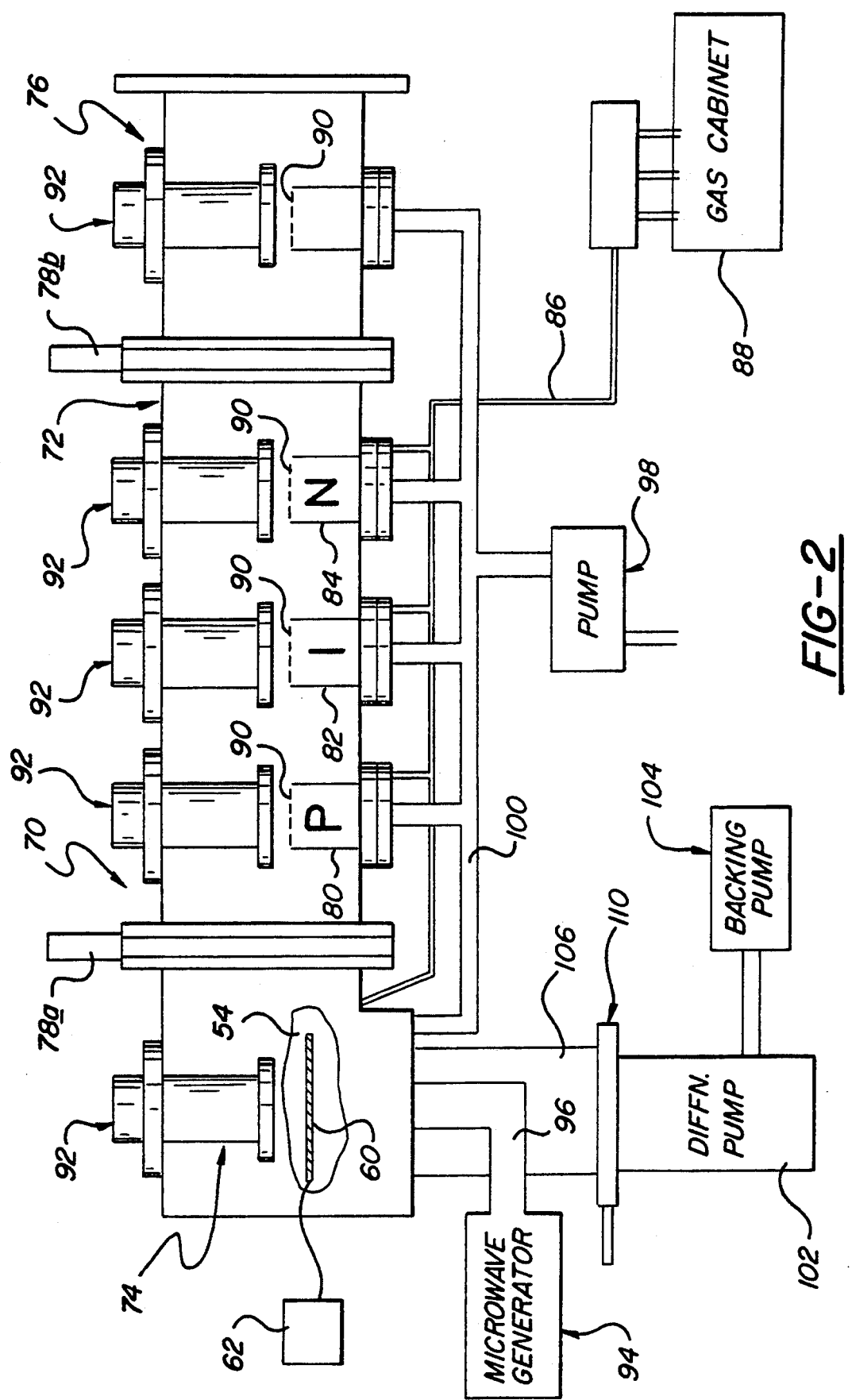
FIG. 2 is a schematic depiction of a multiple chamber microwave/radio frequency deposition apparatus which may be employed in the practice of the present invention.

FIG. 2 depicts a plasma deposition apparatus 70 operative to deposit a plurality of semiconductor layers upon a substrate. The apparatus 70 is notable insofar as it includes a radio frequency energized deposition chamber 72 as well as a microwave energized deposition chamber 74. In this manner, the apparatus 70 may be used for preparation of semiconductor devices under a variety of conditions. The apparatus 70 further includes a loading chamber 76 for removal and replacement of substrates. Separating the R.F. chamber 72, microwave chamber 74 and loading chamber 76 are gate valves 78a, 78b; and as is well known to those of skill in the art, such valves may be readily opened and closed to allow passage of a fairly large substrate between adjoining chambers.

The R.F. chamber 72 includes three separate deposition regions 80, 82, and 84 adapted to deposit p-type, intrinsic and n-type semiconductor layers respectively. Toward that end, each deposition region is provided with a gas supply via a manifolded conduit 86 communicating with a gas supply cabinet 88. Each R.F. deposition region 80, 82, 84 includes a cathode 90 which is energized by radio frequency energy via a power supply (not shown). Each R.F. deposition region 80, 82, 84 further includes a substrate holder and heater assembly 92 which retains and heats a deposition substrate. It will be noted that the loading chamber 76 also includes a substrate heater assembly 92 and further includes a cathode 90. The heater 92 and cathode 90 may be employed to pretreat the substrate, as for example by plasma cleaning, deposition of particular layers and the like as is well known in the art.

The microwave chamber 74 also includes a substrate heater assembly 92, but it will be noted that this chamber 74 includes no cathode assembly. Instead, the microwave chamber is supplied with microwave energy via a microwave generator 92 operatively communicating therewith by a waveguide 96 through a microwave transmissive window as is well known to those of skill in the art. It will also be noted that the microwave chamber 74 includes a bias wire 60 disposed in the plasma region thereof and in electrical communication with a power supply 62.

The apparatus 70 further includes a process pump 98 operatively communicating with the various chambers via a vacuum conduit 100. It will also be noted that the microwave chamber 74 includes a separate pumping system comprised of a diffusion pump 102 having a backing pump 104 associated therewith and operatively connected to the microwave chamber 74 by a conduit 106 and a gate valve 110. The microwave deposition process typically employs a very high flow of process gas and operates in a pressure regime different from the R.F. energized deposition and hence the separate pumping system is typically employed to maintain the proper pressure under these dynamic conditions.

The apparatus 70 may be employed to manufacture a variety of configurations of semiconductor devices. In a typical process, a substrate is placed into the loading chamber 76; the pressure therein is lowered and any pretreatment such as plasma cleaning is carried out. The gate valve 78b is then opened and the substrate transferred by a conveyor system (not shown) to either the R.F. or microwave deposition chambers. By employing the appropriate deposition stations in the R.F. chamber 72, various doped or intrinsic base layers may be placed on the substrate. By opening the gate valve 78a and conveying the substrate into the microwave deposition chamber 74, the deposition of semiconductor layers by microwave energy may be carried out.

EXPERIMENTAL

An experimental series was conducted wherein a number of p-i-n type photovoltaic devices were prepared, each including an intrinsic layer which was deposited from a microwave plasma at a different substrate temperature. Each device comprised a stainless steel substrate having a layer of n-doped silicon alloy material thereupon, an intrinsic silicon-germanium alloy layer and a microcrystalline p-doped silicon alloy top layer. Each device included a top electrode layer fabricated from a transparent conductive oxide material and electrical properties of each resultant device were measured and tabulated hereinbelow. Each device was prepared in an apparatus generally similar to that of FIG. 2.

The first p-i-n type photovoltaic device was prepared by disposing a stainless steel substrate in the n region of the deposition apparatus 70 of FIG. 2. The apparatus was sealed and an atmosphere comprising 20 sccm of hydrogen, 0.75 sccm of a 1% mixture of phosphine and hydrogen and 0.65 sccm of disilane was flowed therethrough. The pump was adjusted to maintain a pressure of 1.2 torr in the chamber. The substrate heater was energized to maintain the substrate at a temperature of approximately 300° C. The gas mixture was energized with radio frequency energy of 13.56 MHz, The cathode was approximately 3.5 inches in diameter and a power of 2 watts was applied thereto. The deposition conditions were maintained until approximately 200 angstroms of n-doped silicon alloy material was deposited on the substrate at which time cathode power was terminated.

The substrate bearing the n layer was transferred to the microwave chamber and the gas gate thereto closed to seal the chamber from the remainder of the apparatus. An atmosphere of 30 sccm of silane, 16 sccm of $GeH_4$ and 30 sccm of He was flowed through the chamber. The pump was adjusted to maintain a pressure of 3 millitorr in the chamber. The substrate heater was energized to heat the substrate to 300° C. Microwave energy of approximately 600 watts at 2.45 GHz was introduced into the chamber. The input of microwaves was maintained for 30 seconds and a layer of intrinsic semiconductor material of approximately 2,000–3,000 angstroms thickness was deposited. During this stage of the deposition a bias of approximately +20 V was maintained on the bias wire.

After completion of the deposition of the intrinsic layer, the gate valve 78a was again opened and the coated substrate conveyed to p region 80 of the RF deposition chamber 72. The chamber was sealed and an atmosphere of 95 sccm of hydrogen, 3.25 sccm of a 2% mixture of $BF_3$ in hydrogen and 2.5 sccm of a 5% mixture of silane in hydrogen was flowed through the chamber. The pump was adjusted to maintain a pressure of 1.7 torr in the chamber and the substrate heater energized to maintain the substrate at a temperature of 175° C. The cathode was approximately 2.7 inches in diameter and energized with 30 watts of radio frequency energy at 13.56 MHz. These conditions provided for the deposition of a microcrystalline layer of p-doped silicon alloy material. The deposition was carried out for a sufficient length of time to deposit a 100 angstrom thick layer onto the intrinsic layer at which time radio frequency energy was terminated and the system purged with argon. The thus completed photovoltaic device was removed from the apparatus and provided with a top electrode of a transparent conductive oxide, TCO material in a conventional vacuum evaporation process. The top electrode was approximately 650 angstroms thick.

A second deposition was carried out utilizing the same gas mixtures and the same basic techniques except the fact that the substrate temperature during the deposition of the intrinsic layer was 375° C. A third device was prepared under similar conditions except that the temperature of the substrate during the deposition of the intrinsic layer was approximately 450° C.

The devices prepared in the foregoing depositions were tested by measuring their open circuit voltage ($V_{oc}$) short circuit current ($J_{sc}$) fill factor (FF) and efficiency (N) under the illumination of an AM-1.5 solar spectrum. The results are tabulated herein below.

|  | Substrate Temperature | | |
| --- | --- | --- | --- |
|  | 300° | 375°C. | 450°C. |
| $V_{oc}$ | .674 V | .65 V | .63 V |
| $J_{sc}$ | 15.96 MA | 17.1 MA | 18.4 MA |
| FF | .53 | .56 | .57 |
| N | 5.71 | 6.2 | 6.6 |

It will be seen from the foregoing that the performance of the photovoltaic device including a microwave deposited intrinsic layer increases with increasing substrate temperature. At some point, the substrate temperature will become high enough to cause the semiconductor material to lose too much hydrogen and/or to begin to crystallize or otherwise degrade. At this point, the efficiency of the device will begin to decrease. The precise temperature at which this occurs will depend upon the specific semiconductor alloy being deposited; however, for most group IV alloy materials, particularly silicon and germanium based materials, it has been found that the preferred upper temperature limit is approximately 550° and the most preferably range of deposition temperatures is between 400° and 500° C.

Figure 3:
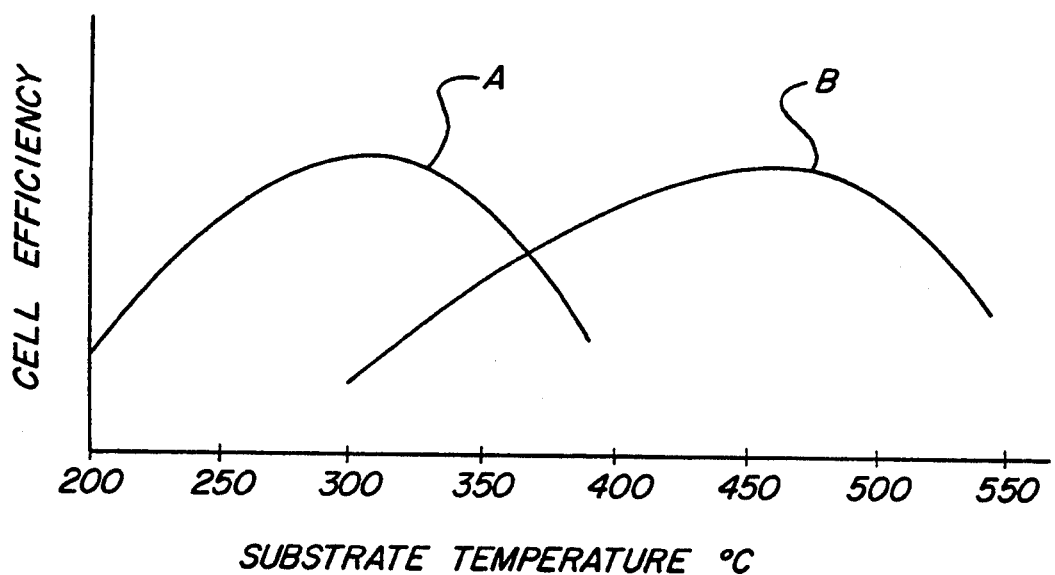
FIG. 3 is a graph of cell efficiency versus substrate temperature for photovoltaic devices manufactured by radio frequency and microwave energized deposition processes.

Referring now to FIG. 3 there is shown a generalized graphic representation of cell efficiency of a photovoltaic device of the p-i-n type plotted versus the substrate temperature at which the intrinsic layer thereof was deposited. Curve A represents deposition conditions for a radio frequency energized process and it will be noted that maximum cell efficiency occurs in the neighborhood of 275°–325° C. In contrast, Curve B depicts cell efficiency data for a microwave energized process and it will be noted that maximum cell efficiency occurs for depositions carried out in the range of 400°–500° C. It should be clear, to those of skill in the art, from this data, that substrate temperatures which are appropriate for radio frequency energized depositions are not optimum for microwave energized depositions and that microwave processes require generally higher substrate temperatures than do comparable radio frequency energized processes.

All the foregoing discussions and experiments have been with regard to photovoltaic devices, particularly p-i-n type photovoltaic devices. It should be appreciated that the methods hereof could be employed for the microwave energized manufacture of semiconductor alloy materials used for other purposes such as image sensors, xerographic drums, electronic devices and the like. It will be understood that numerous modifications and variations of the invention may be practiced. The foregoing drawings, discussion and description are merely meant to be illustrative of particular embodiments of the invention and are not meant to be limitations upon the practice thereof. It is the following claims, including all equivalents, which define the scope of the invention.

We claim:

1. A method for the manufacture of an p-i-n type photovoltaic device of the type comprising a body of substantially intrinsic Group IV semiconductor alloy interposed between two oppositely doped semiconductor layers, said method including the steps of:

I. Depositing a body of semiconductor material of a first conductivity type upon a substrate;

II. Depositing a body of a substantially intrinsic Group IV semiconductor alloy upon said body of semiconductor material of a first conductivity type, by a microwave energized glow discharge deposition process comprising:
a. providing a deposition system having a plasma region defined therein, said system including a conduit for introducing a process gas there into and a source of of microwave energy for activating said process gas in said plasma region so as to decompose said gas and form a plasma therefrom;
b. supporting said substrate, with said body of semiconductor material of a first conductivity type thereupon, in said plasma region;
c. maintaining said substrate at a temperature in excess of 400° C.;
d. introducing a process gas having a Group IV semiconductor element therein into said system;
e. maintaining the process gas at a process pressure which is less than atmospheric;
f. inputting microwave energy into said system at a power level at least sufficient to sustain a plasma of said process gas at said process pressure in said plasma region, whereby said microwave energy creates a plasma from, and decomposes, the process gas so as to deposit a layer of said Group IV semiconductor alloy material on the body of semiconductor material of a first conductivity type; and
III. Depositing a body of semiconductor material of a second conductivity type, opposite said first conductivity type, upon said layer of Group IV semiconductor alloy material.

2. In a method for the manufacture of a p-i-n type photovoltaic device by a process which includes the steps of:

depositing a first, doped layer of a semiconductor material of a first conductivity type on a substrate; depositing a substantially intrinsic layer of a Group IV semiconductor alloy material upon said first doped layer by a microwave energized glow discharge deposition process; and depositing a second doped layer of a semiconductor material of a second conductivity type, opposite said first conductivity type, upon said substantially intrinsic layer, wherein the improvement comprises in combination:

maintaining said substrate, with said first doped layer thereupon, at a temperature which is greater than 400° C., but less than 500° C. during the deposition of said substantially intrinsic layer.

* * * * *